United States Patent [19]

Rosenkrantz et al.

[11] 3,982,201

[45] Sept. 21, 1976

[54] CW SOLID STATE LASER

[75] Inventors: L. Jay Rosenkrantz, Brookfield Center; Robert S. Rowley, Ridgefield, both of Conn.; John B. Schroeder, Vashon, Wash.

[73] Assignee: The Perkin-Elmer Corporation, Norwalk, Conn.

[22] Filed: Jan. 24, 1975

[21] Appl. No.: 543,812

[52] U.S. Cl. .............................. 331/94.5 P; 330/4.3
[51] Int. Cl.² ......................................... H01S 3/094
[58] Field of Search..................... 331/94.5; 330/4.3

[56] References Cited
UNITED STATES PATENTS

| | | | |
|---|---|---|---|
| 3,732,505 | 5/1973 | Freedman | 331/94.5 P |
| 3,753,145 | 8/1973 | Chesler | 331/94.5 P |
| 3,821,663 | 6/1974 | Brenner | 331/94.5 P |

*Primary Examiner*—William L. Sikes
*Attorney, Agent, or Firm*—S. A. Giarratana; F. L. Masselle

[57] ABSTRACT

An efficient continuous wave solid state laser is described. An array of semiconductor diode lasers is employed to generate a pump light source at an absorption wavelength for a solid state laser such as Nd:YAG laser. The array of diode lasers is pulsed at a high repetition rate to produce narrow light pulses which are directed upon an end surface of the solid state laser rod. The pump pulses rate is selected sufficiently high to establish CW operation of the solid state laser while the duty cycle for the pump-light source is sufficiently low to avoid excessive junction heating of the diode lasers, which would substantially reduce their output power.

8 Claims, 3 Drawing Figures

CW SOLID STATE LASER

FIELD OF THE INVENTION

This invention relates to lasers and more specifically, to a CW (continuous wave) laser and a method for operating a laser in a continuous mode.

BACKGROUND OF THE INVENTION

Solid state lasers, such as those constructed of a material known as Nd:YAG, neodymium doped yttrium aluminum garnet, can be stimulated to produce a lasing beam with a light pump. For example, as described in the U.S. Pat. No. 3,624,545 to Ross, a plurality of diode lasers are directed onto a rod shaped Nd:YAG main laser element to stimulate it into a lasing operation. The diode lasers are directed at a side of the main laser element and are provided in sufficient quantity to provide the pumping power necessary to produce pulsed lasing.

The side pumped Ross type laser involves a larger number of diode lasers to obtain the desired pump power needed to stimulate the main laser. The coupling efficiency for this configuration is low because the relatively small diameter of the Nd:YAG laser rod exposed to the pump source limits the effective optical path length of the pump light.

In an article entitled "GaAs Diode Pumped Nd:YAG Laser" by one of the inventors, L. J. Rosenkrantz published in the Journal of the Applied Physics, Vol. 43, No. 11 of November, 1972 at page 4603, a laser is described wherein a diode laser is employed to pump a rod-shaped main laser. The diode laser is directed at an axial end of the main laser to produce laser pulses. The end pumping approach as described in this article increases the absorption of the pumping light by the main laser which thus provides a lasing response at a lower diode laser pump source power level.

SUMMARY OF THE INVENTION

In a continuous wave producing solid state laser in accordance with the invention, a solid state laser rod is end pumped by an array of semiconductor laser sources providing sufficient pump light power at a wavelength and a repetition rate selected to provide a continuous output from the main laser.

As described with respect to a preferred embodiment for a continuously operating solid state laser, a Nd:YAG main laser rod is provided and selectively located to expose an end of the main laser to an array of diode pump lasers. The wavelength of the pump light from the diode lasers is selected for optimum absorption and with an intensity and power to establish continuous lasing from the main laser.

A continuously lasing solid state laser in accordance with the invention is obtained while operating the diode lasers in a pulsed mode. The low duty cycle achieved during pulsed operation enables junction heating of the diode lasers to dissipate between pulses, and permits operation at a substantially higher level of average output power, than would be possible if the diode were to be operated continuously. A long lifetime of the laser pump sources can also be achieved by using low duty cycles. The limited angular spread of the emitted light from the diode lasers enhances optical coupling for enhanced efficiency. The laser pumps may be tuned to the desired pumping wavelength for enhanced absorption by the main laser by controlling their operating temperature.

It, is, therefore, an object of the invention to provide a continuous wave solid state laser and method for operating same. It is a further object of the invention to provide a compact continuously operating solid state laser with enhanced efficiency.

BRIEF DESCRIPTION OF THE DRAWINGS

These and other objects and advantages of a solid state continuous wave laser in accordance with the invention can be understood from the following description of an embodiment described in conjunction with the drawing wherein.

DETAILED DESCRIPTION OF THE INVENTION

Figure 1:
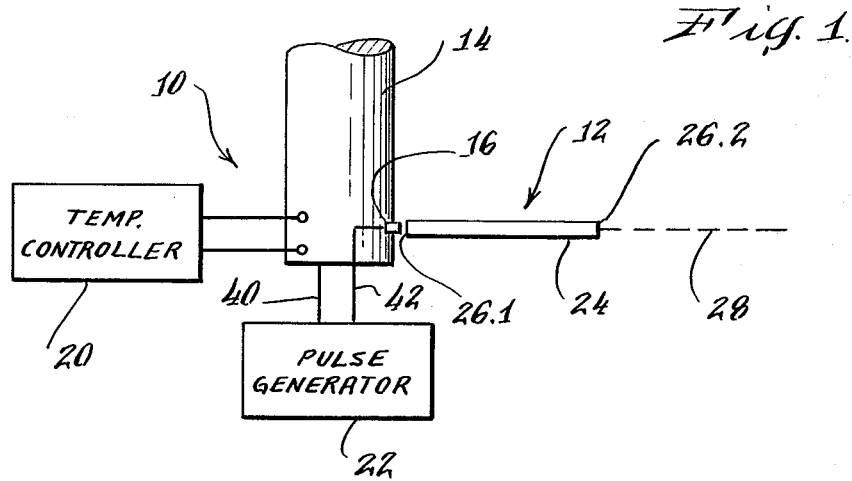
FIG. 1 is a schematic representation of a solid state continuous wave laser for use in connection with this invention.
Figure 2:
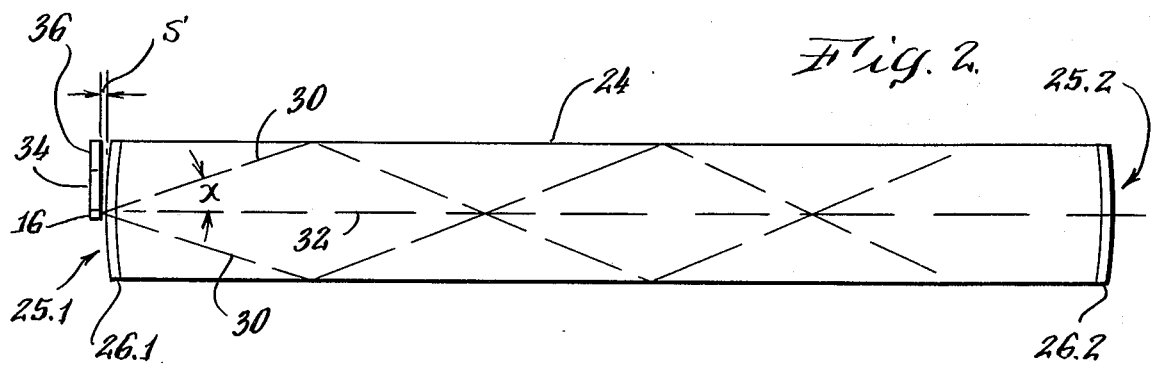
FIG. 2 is an enlarged schematic side view of a main laser rod and laser pump source array used to generate a continuous wave lasing mode in accordance with the invention.
Figure 3:
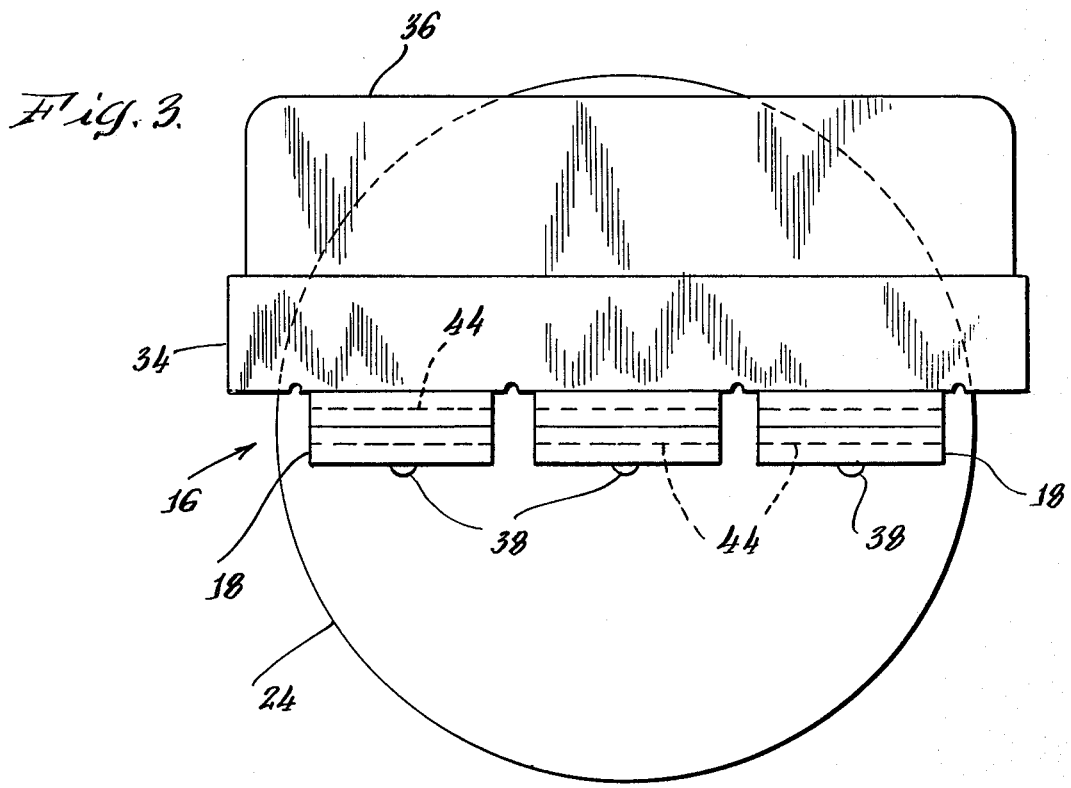
FIG. 3 is an enlarged end view of an array of diode lasers used to stimulate the emission of a continuous wave output from a solid state laser.

With reference to FIGS. 1–3, an apparatus 10 for operating a main laser 12 in accordance with the invention is shown. The main laser 12 is formed and placed as generally described in the previously identified Rosenkrantz article published in the Journal of Applied Physics.

Briefly, the apparatus 10 includes a cold liquid nitrogen dewar heat sink 14 to support an array 16 of laser pump sources 18. A temperature controller 20 is provided to maintain the temperature of the array 16 at a level selected to provide the desired pump wavelength from array 16 for enhanced absorption of the main laser 12 for its continuous lasing mode. A pulse generator 22 is connected to drive the laser pump sources with the proper drive current and pulse frequency.

The main laser 12 is preferably made of a slide polished Nd:YAG laser rod 24 of a length of approximately 25 millimeters and a diameter of the order of 1.5 millimeters. The ends 25.1, 25.2 of rod 24 are curved convex with a two inch radius of curvature. The main laser 12 is provided with end located coatings 26.1, 26.2 selected to enable one end coating 26.1 to transmit the pump source light from array 16 while highly reflecting (about 99.9% reflectivity) the main laser output light beam 28. The end coating 26.2 of laser rod 24 is formed to be less reflective of main laser beam 28, of the order of about 99.6% reflectivity, sufficient to establish a lasing mode with an output beam 28. Coating 26.1 is a standard Fabry-Perot type of spike filter formed of a multi-dielectric layered structure having a high reflectivity at the lasing wavelength for Nd:YAG rod 24 of 1.06 $\mu$ and a high transmission of about 90% in the pump light wavelength range from 8690 to 8865A.

FIG. 2 illustrates the array 16 being closely mounted to the main laser 24 with a spacing, S, of the order of several mils, generally approximately 5 mils. This close spacing enables efficient optical coupling of the pump light 30 which also enters the main laser 24 through end 26.1 at small angles relative to the longitudinal axis 32. The pump light, which enters main laser rod 24, encounters a long optical path within the laser rod 24 either by internal reflections from the polished sides or generally along the optical axis 32. The long optical path within the laser rod ensures substantially complete absorption of the pump light emitted by diode lasers 16 and within the absorption band of main laser rod 24.

As shown in FIG. 3, an array 16 of six diode lasers 18 are mounted in three double stacks located side by side. The diode lasers 18 are formed of single heterostructure GaAs mounted on a beryllium oxide spacer 34. Spacer 34 is mounted to a copper heat sink 36 which is thermally coupled to the heat sink of the liquid nitrogen dewar 14. The diodes 18 are connected electrically in series through contacts 38. The array 16 is electrically coupled across the output lines 40, 42 of pulse generator 22. The pump lasing outputs emanate from junctions 44 and are incident upon end 25.1 of main laser rod 24.

For the operation of the CW laser 12, the temperature tuning (generally to about 150°K) of array 16 can be obtained with temperature controllier 20 to provide pump light wavelengths in an absorption range centered at the 8690A absorption line for the Nd:YAG main laser rod 24. Temperature tuning may also be obtained by heating the junction directly with a selection of the peak current from pulse generator 22. The detection and control of the pump light wavelength can be obtained in a manner well known in the art and as described in the aforementioned Rosenkrantz publication.

The CW operation of main laser 24 is achieved by driving the pump array 16 with narrow current pulses of the order of 200 to 250 nanoseconds wide and with a peak current level of about 15 amperes. Although somewhat longer duration pulses could be used, an increase in pulse length tends to cause a wavelength shift during the pulse due to junction heating.

When the pulse rate from pulse generator 22 is of the order of about 400 KHz, corresponding to a duty cycle of about 8 to 10 percent, a CW operation of the main laser 24 is obtained, although amplitude modulated by a ripple of the same frequency as from the pumped array 16. The ripple amplitude can be reduced to the order of about thirteen percent when the pulse frequency is increased to about 800 KHz.

The relatively low duty cycle required of the pump laser sources to establish a CW operation from main laser enables the extraction of significant average power levels from the array at the operating temperature. An overall slope efficiency of about 3.7% is obtainable with an electrical input power to the array 16 of three watts at maximum output from main laser 24. This efficiency does not include the energy needed for cooling of the array 16.

Having thus described a CW solid state laser in accordance with the invention, its various advantages can be appreciated. The CW laser is particularly useful in spacecraft applications where passive cryogenic cooling of the pump light array can be obtained with heat pipes and the like. The 30° to 40° cone angle of emitted pump light from an array of laser diodes lends itself to the production of higher levels of pump power incident on the end of the laser rod by using appropriate low f-number light collecting lenses or fiber optics.

What is claimed is:

1. A continuous wave producing solid state laser comprising:
   a main solid state laser capable of being end pumped into a lasing mode; and
   an array of pump light emitting semiconductor diode lasers arranged to direct their pump light onto an end of the solid state laser for enhanced absorption in the laser and stimulation of the emission of a laser beam therefrom, means for pulsing the diode lasers of the array at a low duty cycle rate, of not more than ten percent, the pulses each being sufficient to pump the main laser and the repetition rate being sufficient for the pulses to maintain a continuous lasing output from the main laser.

2. The continuous wave producing solid state laser as claimed in claim 1 wherein the solid state laser is formed of a Nd:YAG laser crystal.

3. The continuous wave producing solid state laser as claimed in claim 2 wherein the semiconductor diode lasers are formed of GaAs.

4. The continuous wave producing solid state laser as claimed in claim 1 wherein said main laser is formed of Nd:YAG laser crystal, said semiconductor diode lasers are formed of GaAs, and wherein said duty cycle is not more than about eight percent.

5. A method for operating a solid state laser in a continuous mode comprising the steps of
   arranging a pluraity of pump light producing semiconductor diode lasers to direct a common pump light source at an end of a main solid state laser; and
   pulsing the plurality of semiconductor lasers at a low duty cycle rate of not more than ten percent, making the pulses wide enough to pump the main laser and making the repetition rate sufficient for the pulses to maintain a continuous lasing mode from the solid state laser.

6. The method for operating the solid state laser as claimed in claim 5 wherein the pulsing step is formed by pulsing the pump light sources at a rate of the order of greater than about 400 KHz.

7. The method for operating the solid state laser as claimed in claim 6 wherein the pump light sources are pulsed at a duty cycle of generally less than about 10 percent.

8. The method for operating the solid state laser as claimed in claim 7 wherein the pump light sources are cooled to a temperature level selected to provide a desired absorption wavelength of the solid state laser.

* * * * *